(12) United States Patent
Tanaka (10) Patent No.: US 6,602,746 B2
(45) Date of Patent: Aug. 5, 2003

(54) DUAL-GATE CMOS SEMICONDUCTOR DEVICE MANUFACTURING METHOD

(75) Inventor: Hiroyuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/942,640

(22) Filed: Aug. 31, 2001

(65) Prior Publication Data

US 2002/0027252 A1 Mar. 7, 2002

(30) Foreign Application Priority Data

Sep. 5, 2000 (JP) ...................................... 2000-267972

(51) Int. Cl.⁷ ......................................... H01L 21/8238
(52) U.S. Cl. ...................... 438/201; 438/199; 438/233; 438/283; 438/424
(58) Field of Search ........................ 438/199, 201–233, 438/283, 424, FOR 211, FOR 216

(56) References Cited

U.S. PATENT DOCUMENTS 5,468,669 A * 11/1995 Lee et al. .................... 438/228
5,550,079 A * 8/1996 Lin .............................. 438/587
6,150,247 A * 11/2000 Liaw et al. .................. 438/592
6,214,656 B1 * 4/2001 Liaw ........................... 438/199
6,258,647 B1 * 7/2001 Lee et al. .................... 438/233

FOREIGN PATENT DOCUMENTS

| JP | 5-198686 | 8/1993 |
| JP | 6-104259 | 4/1994 |
| JP | 7-86421 | 3/1995 |

* cited by examiner

Primary Examiner—George Fourson
Assistant Examiner—Thanh Pham
(74) Attorney, Agent, or Firm—Volentine Francos, PLLC (57) ABSTRACT

A manufacturing method for a dual-gate CMOS semiconductor device that suppresses mutual diffusion of P type impurities and N type impurities in a gate electrode. An NMOS part and a PMOS part are formed on a semiconductor substrate. A polycrystalline silicon layer is formed on the NMOS part and the PMOS part, and consists of an N type impurity containing polycrystalline silicon layer and a P type impurity containing polycrystalline silicon layer. A first conductive layer is formed on the polycrystalline silicon layer so as to include a groove region, in which the first conductive layer is not formed, on a predetermined region including a boundary between the N type impurity containing polycrystalline silicon layer and the P type impurity containing polycrystalline silicon layer.

13 Claims, 10 Drawing Sheets

DUAL-GATE CMOS SEMICONDUCTOR DEVICE MANUFACTURING METHOD

BACKGROUND OF THE INVENTION

1. Field of the Invention

The present invention relates to a dual-gate CMOS semiconductor device and a dual-gate CMOS semiconductor device manufacturing method. More specifically, the present invention relates to a dual-gate CMOS semiconductor device and a dual-gate CMOS semiconductor device manufacturing method capable of reducing the mutual diffusion of impurities in a gate electrode.

2. Description of Related Art

In recent years, CMOS semiconductor devices of a dual-gate structure have been adopted with a view of improving performance and reducing power consumption. As the gate electrodes of this dual-gate structure, a polycrystalline silicon layer containing N type impurities such as arsenic is used on an NMOS part and a polycrystalline silicon layer containing P type impurities such as boron is used on a PMOS part.

The semiconductor device of such a dual-gate structure is disclosed by, for example, "M. Togo, et al., Thermal Robust Dual-Gate CMOs Integration Technologies for High-Performance DRAM-Embedded ASCIs', IEDM Technical Digest, p. 49 (1999)".

According to the above-cited document, a so-called W polyside structure in which a WSi2 layer is built up on a polycrystalline silicon layer, is used as a gate electrode. This gate electrode is normally employed in a device having a mixture of a DRAM and Logic. In addition, for the purpose of realizing higher integration, a so-called SAC structure for providing contacts on a source/drain layer in a self-aligned manner to a gate electrode by forming a nitride film on the WSi2 layer and also forming a nitride film on a sidewall.

The conventional dual-gate CMOS semiconductor device, however, has the following disadvantages. A heat treatment is conducted to form elements after the formation of a gate electrode. Due to this, impurities contained in a polycrystalline silicon layer on an NMOS part and those contained in a polycrystalline silicon layer on a PMOS part are mutually diffused through the WSi2 layer. In other words, N type impurities are introduced into the polycrystalline silicon layer on the PMOS part and P type impurities are introduced into the polycrystalline silicon layer on the NMOS part, with the result that the performance of the semiconductor device disadvantageously deteriorates.

SUMMARY OF THE INVENTION

It is, therefore, an object of the present invention to provide a novel, improved dual-gate CMOS semiconductor device and a manufacturing method therefor capable of suppressing the mutual diffusion of P type impurities and N type impurities in polycrystalline silicon layers on a gate electrode.

To obtain the above object, a typical invention of the present invention provides a dual-gate CMOS semiconductor device characterized by comprising: an NMOS part and a PMOS part formed on a semiconductor substrate; and a gate electrode formed on the NMOS part and the PMOS part, and constituted out of a polycrystalline silicon layer and a first conductive layer, and characterized in that the polycrystalline silicon layer is constituted out of a polycrystalline silicon layer containing N type impurities and a polycrystalline silicon layer containing P type impurities; and the first conductive layer has a groove region on a predetermined region including a boundary between the polycrystalline silicon layer containing the N type impurities and the polycrystalline silicon layer containing the P type impurities, the first conductive layer not being formed in the groove region.

According to the above-stated invention, the first conductive layer on the PMOS part and the first conductive layer on the NMOS part are isolated from each other by the formation of the groove region. It is, therefore, possible to reduce the mutual diffusion of the P type impurities and the N type impurities in the polycrystalline silicon layers.

"Furthermore, to obtain the above object, another typical invention of the present application provides a dual-gate CMOS semiconductor device manufacturing method characterized by: forming a P well and an N well on a semiconductor substrate using a first masking pattern; forming a gate insulating film on the P well and the N well formed on the semiconductor substrate; forming a polycrystalline silicon layer constituted out of a polycrystalline silicon layer containing N type impurities and a polycrystalline silicon layer containing P type impurities, on the gate insulating film; forming a first conductive layer on an entire surface on the polycrystalline silicon layer; removing the first conductive layer on a predetermined region including a boundary between the polycrystalline silicon layer containing the N type impurities and the polycrystalline silicon layer containing the P type impurities while using a second masking pattern, and thereby forming a groove region; forming a gate electrode by a photolithographic method and an etching method; and forming a source/drain layer on each of the P well and the N well by the photolithographic method and an ion implantation method, after forming the gate electrode."

The above-stated invention can provide a semiconductor device wherein the first conductive layer on the PMOS part is isolated from the first conductive layer on the NMOS part by a boundary portion. As a result, it is possible to reduce the mutual diffusion of the P type impurities and the N type impurities in the polycrystalline silicon layers through the first conductive layers.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

FIG. 1 is an explanatory view showing the constitution of a semiconductor device in the first embodiment according to the present invention;

FIG. 2 is a cross-sectional view showing a manufacturing method for the semiconductor device in the first embodiment;

FIG. 3 is an explanatory view showing the constitution of a semiconductor device in the second embodiment according to the present invention;

FIG. 4 is a cross-sectional view showing a manufacturing method for the semiconductor device in the second embodiment;

FIG. 5 is an explanatory view showing the constitution of a semiconductor device in the third embodiment according to the present invention;

FIG. 6 is a cross-sectional view showing a manufacturing method for the semiconductor device in the third embodiment;

FIG. 7 is an explanatory view showing the constitution of a semiconductor device in the fourth embodiment according to the present invention;

FIG. 8 is a cross-sectional view showing a manufacturing method for the semiconductor device in the fourth embodiment;

FIG. 9 is an explanatory view showing the constitution of a semiconductor device in the fifth embodiment according to the present invention; and FIG. 10 is a cross-sectional view showing a manufacturing method for the semiconductor device in the fifth embodiment.

DESCRIPTION OF THE PREFERRED EMBODIMENTS OF THE INVENTION

The prefer embodiments of the present invention will be described hereinafter in detail with reference to the accompanying drawing. It is noted that constituent elements having the same functions and constitutions are denoted by the same reference symbols in the description given hereinafter and the drawings and repetitive description will not be given.

First Embodiment

In the first embodiment, differently from the conventional semiconductor device, a groove region is formed in a WSi2 layer (or tungsten silicide layer) on a boundary region between an NMOS part and a PMOS part to thereby isolate the WSi2 layer on the NMOS part from the WSi2 layer on the PMOS part.

Figure 1A:
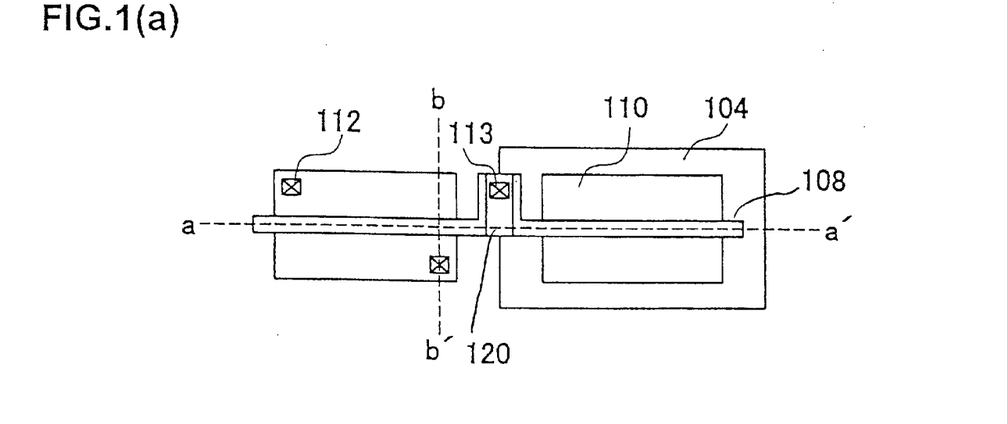
Figure 1B:
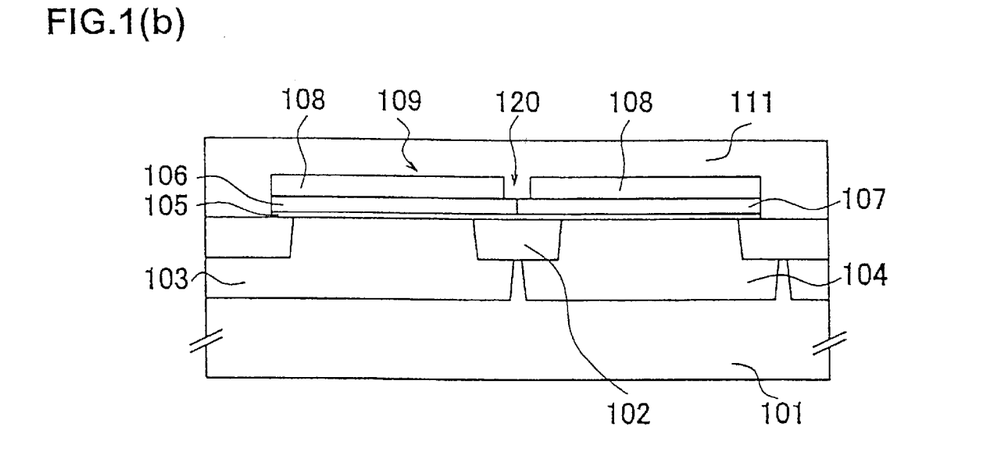
Figure 1C:
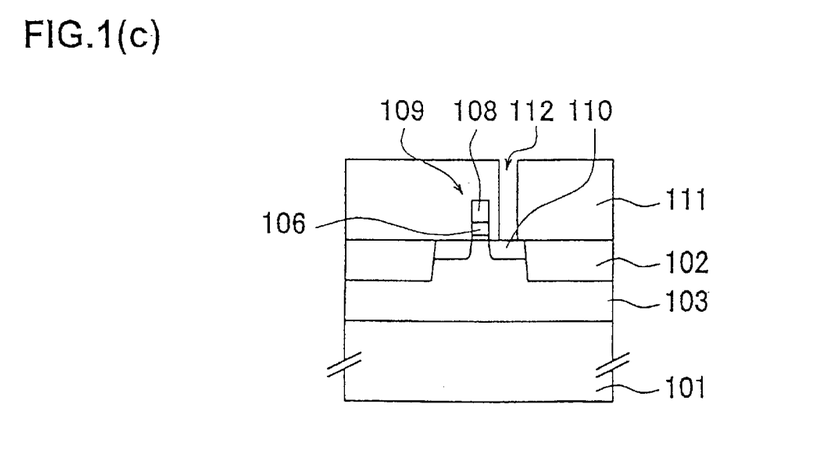

The constitution of a semiconductor device in the first embodiment will be described with reference to FIG. 1. FIG. 1A is a top view showing the constitution of the semiconductor device in the first embodiment. FIG. 1B is a cross-sectional view taken along line a–a' of FIG. 1A, showing the constitution of the semiconductor device in this embodiment. FIG. 1C is a cross-sectional view taken along line b–b' of FIG. 1A, showing the constitution of the semiconductor device in this embodiment.

First, as shown in FIG. 1, an element isolation insulating film 102 is formed on a silicon substrate 101 by, for example, an STI method. Impurities are injected into an NMOS part and a PMOS part by a photolithographic method and an implantation method so as to form a P well 103 and an N well 104, respectively. Also, source/drain layers 110 are formed on the P well 103 and N well 104, respectively by the photolithographic method and the implantation method.

A gate oxide film 105 is formed on the P well 103 and the N well 104 by, for example, a thermal oxidization method and polycrystalline silicon layers 106 and 107 are deposited on the gate oxide film 105. N type impurities such as arsenic are injected into the polycrystalline silicon layer on the NMOS part and P type impurities such as boron are injected into the polycrystalline silicon layer on the PMOS part by, for example, the photolithographic method and the implantation method, thereby forming an N+ polycrystalline layer 106 and a P+ polycrystalline layer 107, respectively.

The first conductive layer 108 such as a WSi2 layer is formed on the polycrystalline silicon layers 106 and 107 by, for example, a sputtering method or a CVD method. In this embodiment, differently from the conventional semiconductor device, a groove region 120 is formed in the WSi2 layer 108 on the boundary region between the NMOS part and the PMOS part, thereby isolating the WSi2 layer 108 on the NMOS part from the WSi2 layer 108 on the PMOS part.

In addition, a gate electrode 109 is formed by the photolithographic method and the etching method and an oxide film 111 is formed on the gate electrode 109 by, for example, the CVD method. Further, a contact 112 is formed on the source/drain layer 110 and a contact 113 is formed on the gate electrode 109.

"In this embodiment, the WSi2 layer 108 on the NMOS part is isolated from the WSi2 layer 108 on the PMOS pert by forming the groove region 120, it is possible to reduce the mutual diffusion of the P type impurities and the N type impurities in the polycrystalline silicon layers through the WSi2 layers."

Next, referring to FIG. 2, a method of manufacturing the semiconductor device in the first embodiment will be described. FIG. 2 is a cross-sectional view for manufacturing steps showing the semiconductor method manufacturing method in this embodiment.

Figure 2A:
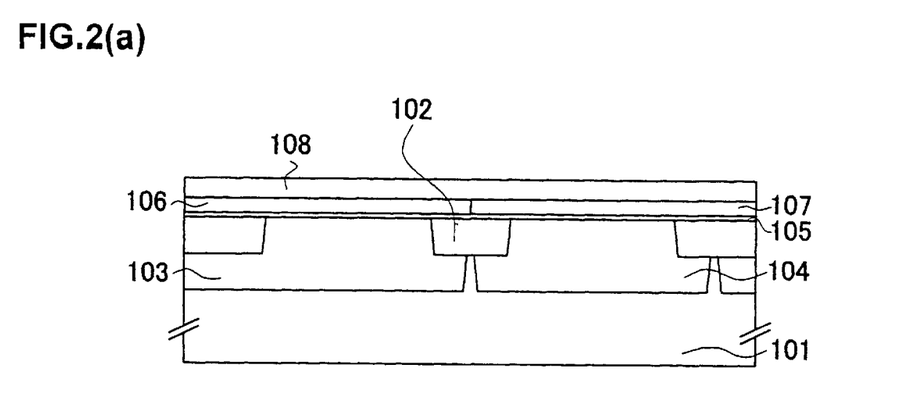

First, as shown in FIG. 2A, an element isolation insulating film 102 is formed on a silicon substrate 101 by, for example, the STI method so as to isolate elements. Then, impurities are injected into an NMOS part and a PMOS part, respectively, by the photolithographic method and the implantation method to thereby form a P well 103 and an N well 104, respectively.

Next, after forming a gate oxide film 105 on the entire surface by, for example, the thermal oxidization method, polycrystalline silicon layers 106 and 107 are deposited on the gate oxide film 105. Further, arsenic and boron are injected into the polycrystalline silicon layers 106 and 107 on the NMOS part and the PMOS part, respectively, by the photolithographic method and the implantation method and activated by a heat treatment, thereby forming a polycrystalline silicon layer consisting of an N+ polycrystalline silicon layer 106 and a P+ polycrystalline silicon layer 107. Further, a WSi2 layer 108 is deposited on the entire surface by, for example, the sputtering method or CVD method.

Figure 2B:
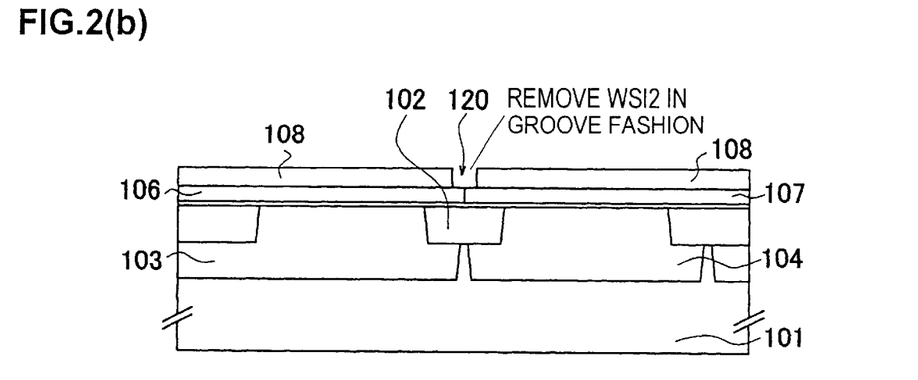

Thereafter, as shown in FIG. 2B, the WSi2 layer 108 on the boundary portion between the NMOS part and the PMOS part is removed by, for example, the photolithographic method or etching method to form a groove region 120. It is noted that mask data used by this photolithographic method or the like can be created by synthesizing mask data used in the well formation step.

Figure 2C:
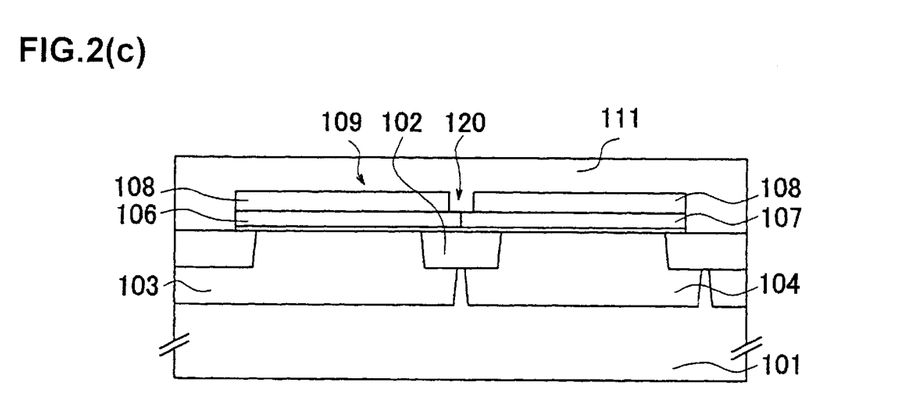

Next, as shown in FIG. 2C, a gate electrode 109 is formed by, for example, the photolithographic method and the etching method and source/drain layers 110 are formed on the P well 103 and the N well 104, respectively by, for example, the photolithographic method and the implantation method. Then, an oxide film 111 is deposited on the entire surface by, for example, the CVD method and contacts 112 and 113 are formed on the source/drain layer 110 and the gate electrode 109, respectively by, for example, the photolithographic method and the etching method.

In this embodiment, the groove region is formed in the WSi2 layer on the boundary region between the NMOS part and the PMOS part, and the WSi2 layer on the NMOS part is isolated from the WSi2 layer on the PMOS part. This can reduce the mutual diffusion of the N type impurities and the P type impurities in the polycrystalline silicon layer through the WSi2 layers.

Second Embodiment

In the first embodiment stated above, description has been given to a case where the groove region is formed in the WSi2 layer on the boundary region between the NMOS part and the PMOS part and where the WSi2 layer on the NMOS part and the WSi2 layer on the PMOS part are isolated from each other. In the second embodiment, a CoSi2 layer (or cobalt silicide layer) having a low impurity diffusion coefficient and high conductivity is formed on a polycrystalline silicon layer on the bottom of a groove region on the first conductive layer.

Figure 3A:
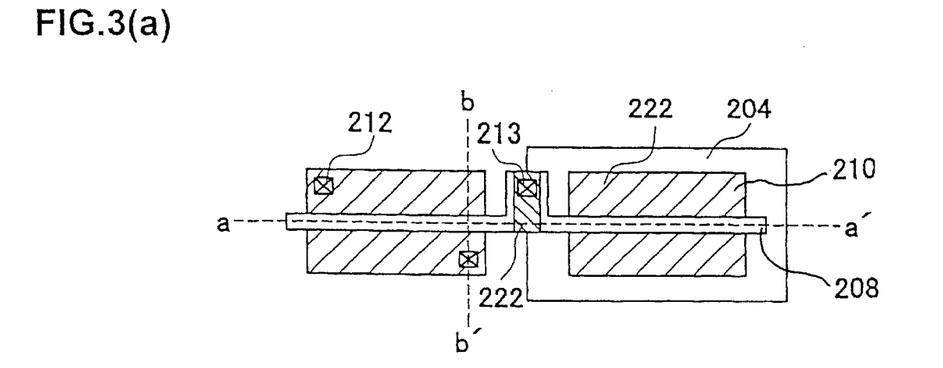
Figure 3B:
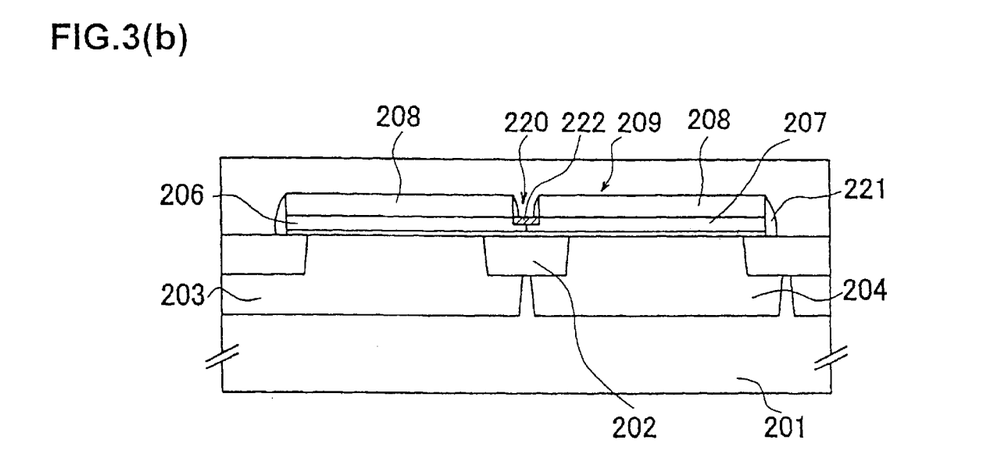
Figure 3C:
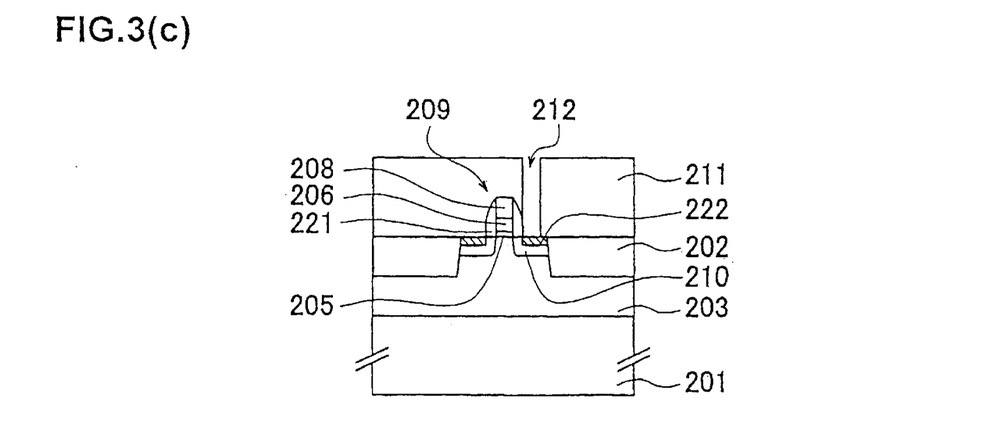

Now, the constitution of a semiconductor device in the second embodiment will be described with reference to FIG. 3. FIG. 3A is a top view showing the constitution of the semiconductor device in the second embodiment. FIG. 3B is a cross-sectional view taken along line a–a' of FIG. 3A, showing the constitution of the semiconductor device in this embodiment. FIG. 3C is a cross-sectional view taken along line b–b' of FIG. 3A, showing the constitution of the semiconductor device in this embodiment.

First, as shown in FIG. 3, an element isolation insulating film 202 is formed on a silicon substrate 201 by, for example, the STI method. Impurities are injected into an NMOS part and a PMOS part, respectively by, for example, the photolithographic method and the implantation method, thereby forming a P well 203 and an N well 204, respectively. Also, a source/drain layer 210 is formed on each of the P well 203 and the N well 204 by, for example, the photolithographic method and the implantation method.

A gate oxide film 205 is formed on the entire surface on the P well 203 and the N well 204 by, for example, the thermal oxidization method. Polycrystalline silicon layers 206 and 207 are deposited on the gate oxide film 205. N type impurities such as arsenic are injected into the polycrystalline silicon layer 206 on the NMOS part and P type impurities such as boron are injected into the polycrystalline silicon layer 207 on the PMOS part by, for example, the photolithographic method and the implantation method, thereby forming an N$^+$ polycrystalline silicon layer 206 and a P$^+$ polycrystalline silicon layer 207, respectively.

The first conductive layer 208 such as a WSi2 layer is formed on the polycrystalline silicon layers 206 and 207 by, for example, the sputtering method or the CVD method. Also, a groove region 220 is formed on the boundary portion between the NMOS part and the PMOS part to thereby isolate the WSi2 layer 208 on the NMOS part from the WSi2 layer 208 on the PMOS part as in the case of the first embodiment. Further, a gate electrode 209 is formed by the photolithographic method and the etching method and an oxide film 211 is formed on the gate electrode 209 by, for example, the CVD method. Sidewalls 221 made of nitride films are formed on the side surface of the gate electrode 209 and the side surface of the groove region 220, respectively.

Further, in the second embodiment, differently from the first embodiment, a CoSi2 layer 222 having a low impurity diffusion coefficient and high conductivity is formed on the polycrystalline silicon layers 206 and 207 exposed to the bottom of the groove region. As shown in FIG. 3C, this CoSi2 layer 222 is also formed on the source/drain layer 210.

Contacts 212 and 213 are formed on the source/drain layer 210 and the gate electrode 209, respectively.

In this embodiment, differently from the first embodiment, the CoSi2 layer having a low impurity diffusion coefficient and high conductivity is formed on the bottom of the groove region. As a result, it is possible to reduce the mutual diffusion of the P type impurities and the N type impurities in the polycrystalline silicon layers and to prevent more effectively the resistance of the gate electrode from increasing due to the formation of the groove region.

Figure 4A:
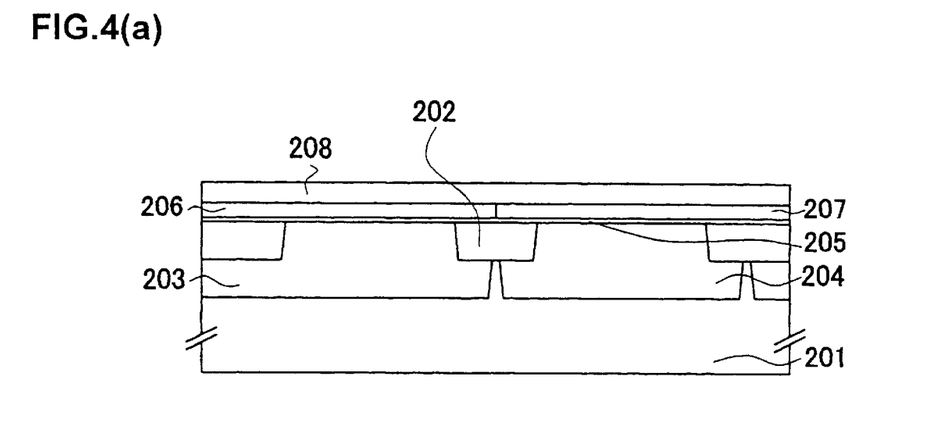
Figure 4B:
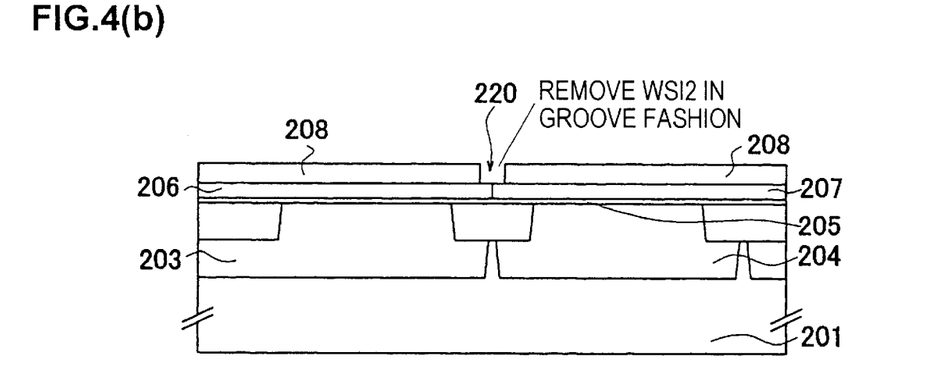

Next, referring to FIG. 4, a method for manufacturing the semiconductor device in the second embodiment will be described. FIG. 4 is a cross-sectional view for manufacturing steps showing the semiconductor device manufacturing method in this embodiment. Since the steps (FIGS. 4A and 4B) of the semiconductor device manufacturing method in this embodiment until a groove region is formed are the same as those in the first embodiment (FIGS. 2A and 2B), no description will be given to these steps herein.

Figure 4C:
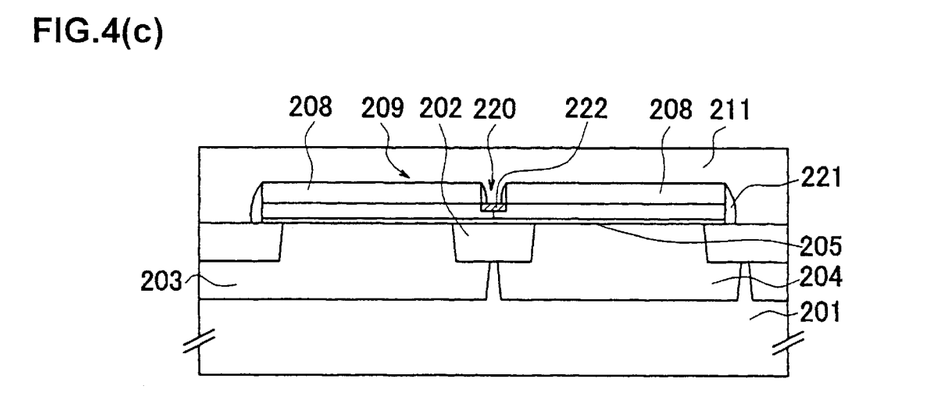

As shown in FIG. 4C, after a WSi2 layer 208 on the boundary portion between an NMOS part and a PMOS part is removed by the photolithographic method and the etching method to thereby form a groove region 220, a gate electrode 209 is formed by, for example, the photolithographic method and the etching method. A source/drain layer 210 is then formed on each of a P well 203 and an N well 204 by the photolithographic method and the implantation method.

Next, a nitride film is deposited on the entire surface by, for example, the CVD method and then a sidewall 221 made of a nitride film is formed by the etching method.

After forming a Co (cobalt) layer on the entire surface, a CoSi2 layer 222 is formed on the source/drain layer through the first heat treatment step for forming silicide, a removal step for removing unreacted Co and the second heat treatment step for forming silicide. At this moment, since the WSi2 layer 208 is removed on the boundary portion between the NMOS part and the PMOS part, the CoSi2 layer 222 is formed on the surfaces of the polycrystalline silicon layers 206 and 207 on the bottom of the groove region 220, as well. In this way, the CoSi2 layer 222 can be formed in a self-aligned manner by reacting Co to the polycrystalline silicon layers 206 and 207 exposed on the bottom of the groove region 220 and to the source/drain layer 210.

Thereafter, an oxide film 211 is formed on the entire surface by, for example, the CVD method and then contacts 212 and 213 are formed on the source/drain layer 210 and the gate electrode 209, respectively by, for example, the photolithographic method and the etching method.

As can be seen from the above, in the second embodiment, it is possible to provide a semiconductor device capable of reducing the mutual diffusion of the P type impurities and the N type impurities in the polycrystalline silicon layers and preventing the resistance of the gate electrode from increasing due to the formation of the groove region.

Third Embodiment

In the first embodiment stated above, description has been given to a case where the groove region is formed in the WSi2 layer on the boundary region between the NMOS part and the PMOS part and where the WSi2 layer on the NMOS part and the WSi2 layer on the PMOS part are isolated from each other. In the third embodiment, an oxide film almost equal in height to a WSi2 layer is formed in a groove region.

Figure 5A:
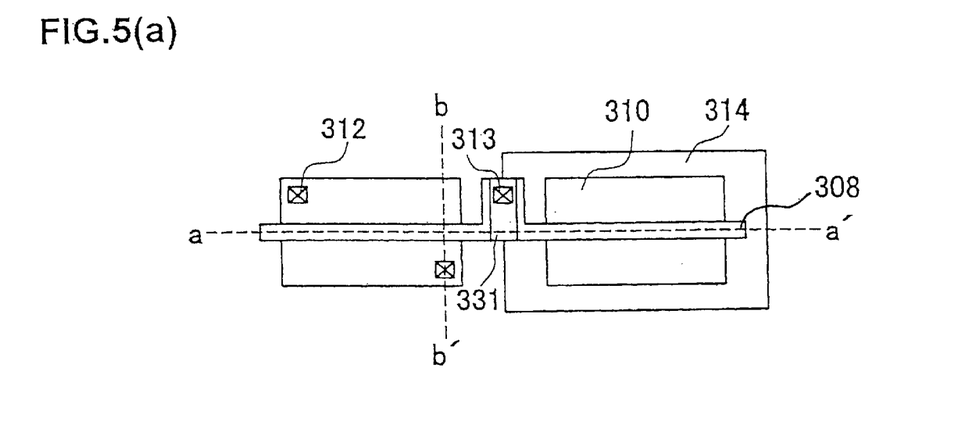
Figure 5B:
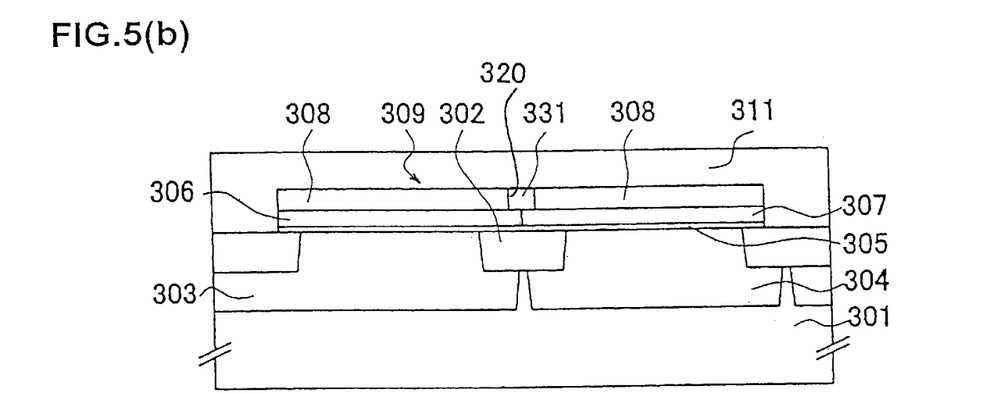
Figure 5C:
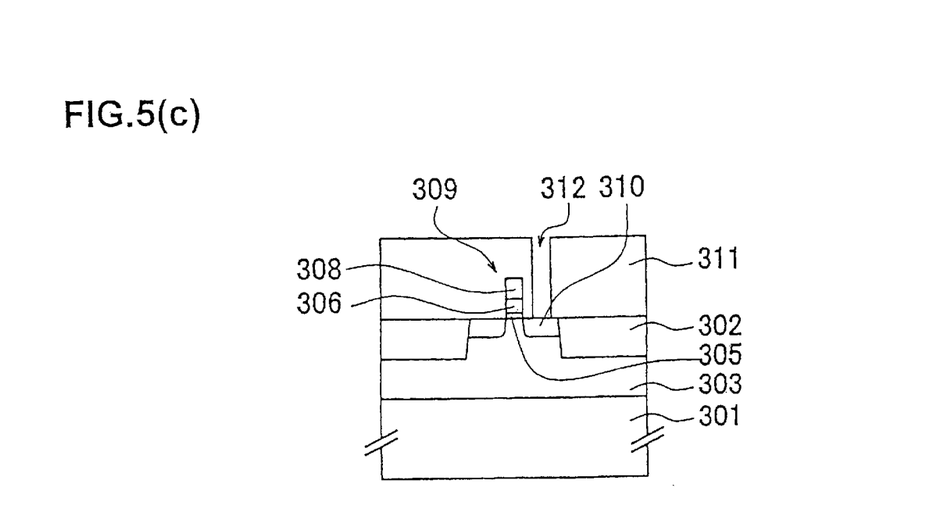

Now, referring to FIG. 5, the constitution of a semiconductor device in the third embodiment will be described. FIG. 5A is a top view showing the constitution of the semiconductor device in the third embodiment. FIG. 5B is a cross-sectional view taken along line a–a' of FIG. 5A. FIG. 5C is a cross-sectional view taken along line b–b' of FIG. 5A.

First, as shown in FIG. 5, an element isolation insulating film 302 is formed on a silicon substrate 301 by, for example, the STI method. Impurities are injected into an NMOS part and a PMOS part by the photolithographic method and the implantation method, thereby forming a P well 303 and an N well 304, respectively. Also, a source/drain layer 310 is formed on each of the P well 303 and the N well 304 by the photolithographic method and the implantation method.

A gate oxide film 305 is formed on the entire surface on the P well 303 and the N well 304 by, for example, the thermal oxidization method. Polycrystalline silicon layers 306 and 307 are deposited on the gate oxide film 305. N type impurities such as arsenic are injected into the polycrystalline silicon layer 306 on the NMOS part and P type impurities such as boron are injected into the polycrystalline silicon layer 307 on the PMOS part by, for example, the photolithographic method and the implantation method, thereby forming an N+ polycrystalline silicon layer 306 and a P+ polycrystalline silicon layer 307, respectively.

The first conductive layer 308 such as a WSi2 layer is formed on the polycrystalline silicon layers 306 and 307 by, for example, the sputtering method or the CVD method. Also, a groove region 320 is formed in the boundary portion between the NMOS part and the PMOS part to thereby isolate the WSi2 layer 308 on the NMOS part from the WSi2 layer 308 on the PMOS part as in the case of the first embodiment.

"In the third embodiment, differently from the first embodiment, an oxide film 331 almost equal in height as the first conductive layer (or WSi2 layer) is formed in the groove region. As a result, no stepped portion is formed on the boundary between the NMOS part and the PMOS part, thus facilitating a fine processing for forming a gate electrode."

In addition, a gate electrode 309 is formed by the photolithographic method and the etching method and an oxide film 311 is formed on the gate electrode 309 by, for example, the CVD method. Further, contacts 312 and 313 are formed on the source/drain layer 310 and the gate electrode 309, respectively.

In this embodiment, differently from the first embodiment, the oxide film almost equal in height to the first conductive layer (or WSi2 layer) is formed in the groove region and no stepped portion is formed on the boundary between the NMOS part and the PMOS part. This can reduce the mutual diffusion of the P type impurities and the N type impurities in the polycrystalline silicon layers and facilitate a fine processing for forming the gate electrode.

Figure 6A:
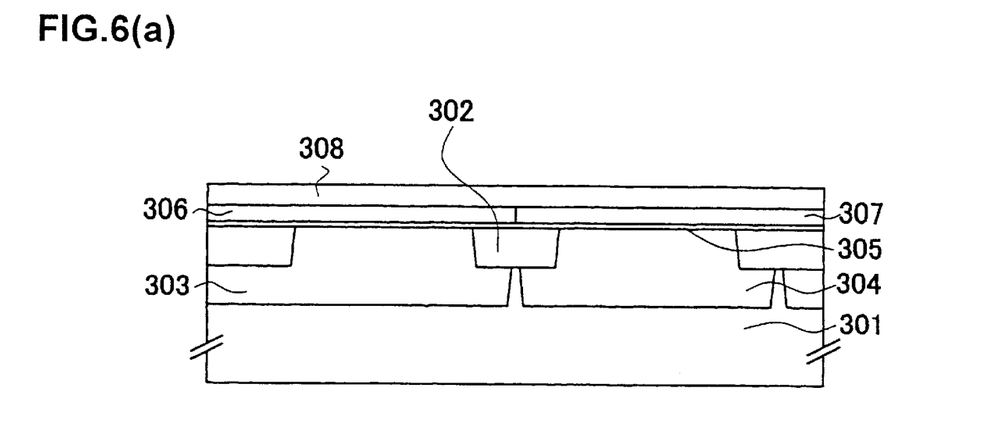
Figure 6B:
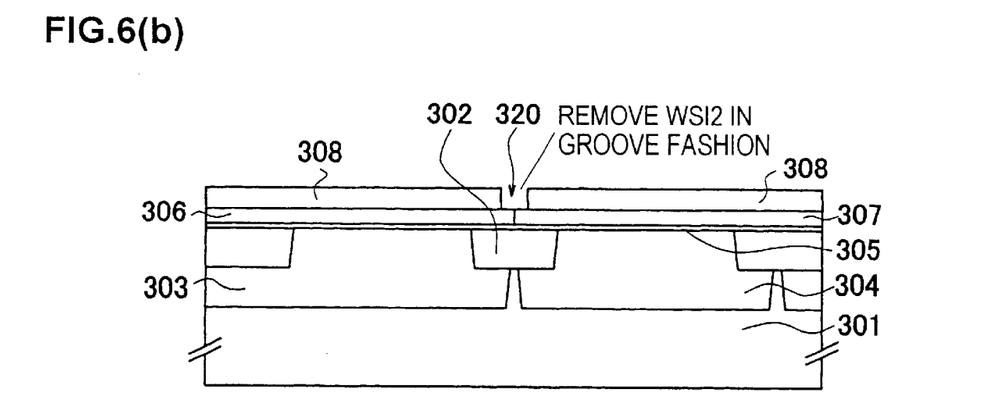

Next, referring to FIG. 6, a method for manufacturing the semiconductor device in the third embodiment will be described. FIG. 6 is a cross-sectional view for manufacturing steps showing the semiconductor device manufacturing method in this embodiment. Since the steps (FIGS. 6A and 6B) of the semiconductor device manufacturing method in this embodiment until a groove region is formed are the same as those in the first embodiment (FIGS. 2A and 2B), no description will be given to these steps herein.

Figure 6C:
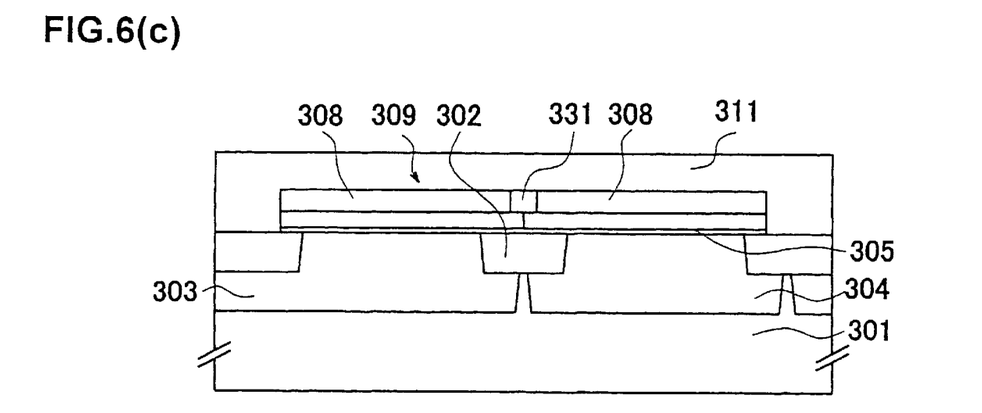

As shown in FIG. 6C, after a WSi2 layer 308 on the boundary portion between an NMOS part and a PMOS part is removed by the photolithographic method and the etching method to form a groove region 320, an oxide film 331 is formed on the entire surface by, for example, the CVD method and an oxide film 331 is formed only in the groove region 320 by the etching method. Then, a gate electrode 309 is then formed by the photolithographic method and the etching method and a source/drain layer 310 is formed on the P well 303 and the N well 304 by the photolithographic method and the implantation method.

Thereafter, after an oxide film 311 is formed on the entire surface by, for example, the CVD method, contacts 312 and 313 are formed on the source/drain layer 310 and the gate electrode 309, respectively by the photolithographic method and the etching method.

As can be seen, in this embodiment, differently from the first embodiment, the oxide film almost equal in height to the first conductive layer (or WSi2 layer) is formed in the groove region and no stepped portion is formed on the boundary between the NMOS part and the PMOS part. As a result, it is possible to reduce the mutual diffusion of the P type impurities and the N type impurities in the polycrystalline silicon layers and to facilitate a fine processing for forming the gate electrode because no stepped portion is formed on the boundary between the NMOS part and the PMOS part.

Fourth Embodiment

In the first embodiment stated above, description has been given to a case where the groove region is formed in the WSi2 layer in the boundary region between the NMOS part and the PMOS part and where the WSi2 layer on the NMOS part and the WSi2 layer on the PMOS part are isolated from each other. In the fourth embodiment, a nitride film is formed on the entire surface on a WSi2 layer including the interior of a groove region.

Figure 7A:
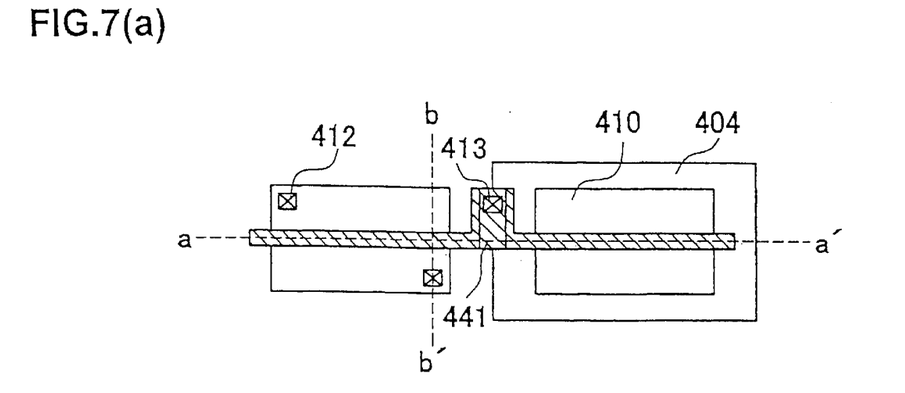
Figure 7B:
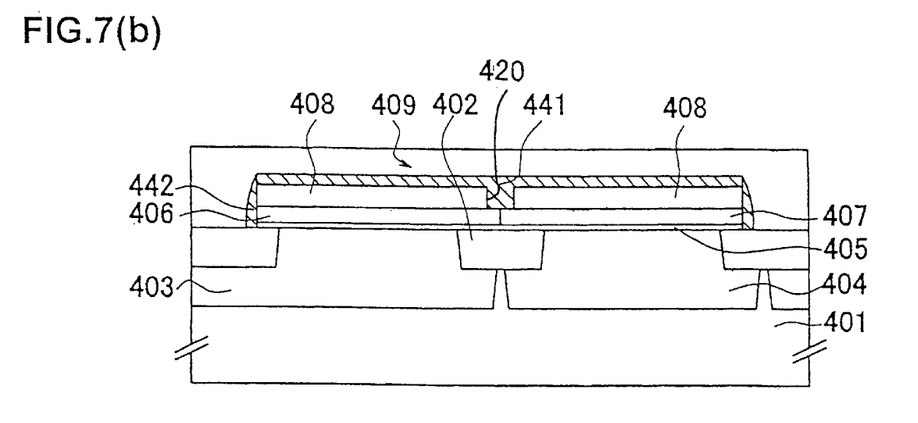
Figure 7C:
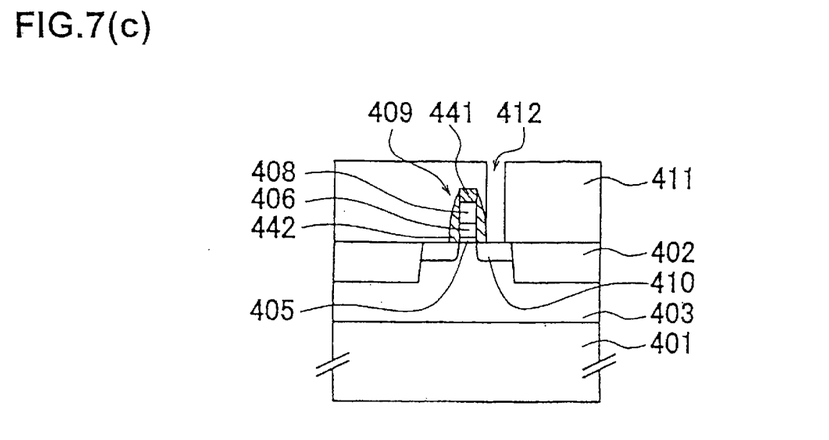

Now, referring to FIG. 7, the constitution of a semiconductor device in the fourth embodiment will be described. FIG. 7A is a top view showing the constitution of the semiconductor device in the third embodiment. FIG. 7B is a cross-sectional view taken along line a–a' of FIG. 7A. FIG. 7C is a cross-sectional view taken along line b–b' of FIG. 7A.

First, as shown in FIG. 7, an element isolation insulating film 402 is formed on a silicon substrate 401 by, for example, the STI method. Impurities are injected into an NMOS part and a PMOS part by the photolithographic method and the implantation method, thereby forming a P well 403 and an N well 404, respectively. Also, a source/drain layer 410 is formed on each of the P well 403 and the N well 404 by the photolithographic method and the implantation method.

A gate oxide film 405 is formed on the entire surface on the P well 403 and the N well 404 by, for example, the thermal oxidization method. Polycrystalline silicon layers 406 and 407 are deposited on the gate oxide film 405. N type impurities such as arsenic are injected into the polycrystalline silicon layer 406 on the NMOS part and P type impurities such as boron are injected into the polycrystalline silicon layer 407 on the PMOS part by, for example, the photolithographic method and the implantation method, thereby forming an N+ polycrystalline silicon layer 406 and a P+ polycrystalline silicon layer 407, respectively.

The first conductive layer 408 such as a WSi2 layer is formed on the polycrystalline silicon layers 406 and 407 by, for example, the sputtering method or the CVD method. Also, a groove region 420 is formed in the WSi2 layer 408 on the boundary portion between the NMOS part and the PMOS part to thereby isolate the WSi2 layer 408 on the NMOS part from the WSi2 layer 408 on the PMOS part as in the case of the first embodiment. Further, a gate electrode 409 is formed by the photolithographic method and the etching method and an oxide film 411 is formed on the gate electrode 409 by, for example, the CVD method.

In the fourth embodiment, differently from the first embodiment, a nitride film 441 is formed in the groove region 420 and on the entire surface on the WSi2 layer 408 as shown in FIGS. 7B and 7C. As shown in FIG. 7C, a sidewall 442 made of a nitride film is formed on the gate electrode 409.

Further, contacts 412 and 413 are formed on the source/drain layer 410 and the gate electrode 409, respectively. As shown in FIG. 7A, while no nitride film is formed in a region on the source/drain layer 410 in which region the contact 412 is formed, a nitride film is formed in a region on the gate electrode 409 in which region the contact 413 is formed. Due to this, the contact 412 on the source/drain layer 410 and the contact 413 on the gate electrode 409 cannot be formed in the same step but formed in different steps.

In the fourth embodiment, differently from the first embodiment, the nitride film is formed in the groove region and on the entire surface on the WSi2 layer and the sidewall made of the nitride film is formed on the gate electrode portion. As can be seen, since the sidewall made of the nitride film is formed on the gate electrode portion, it is possible to form the contact on the source/drain layer in a self-aligned manner to the gate electrode.

Figure 8A:
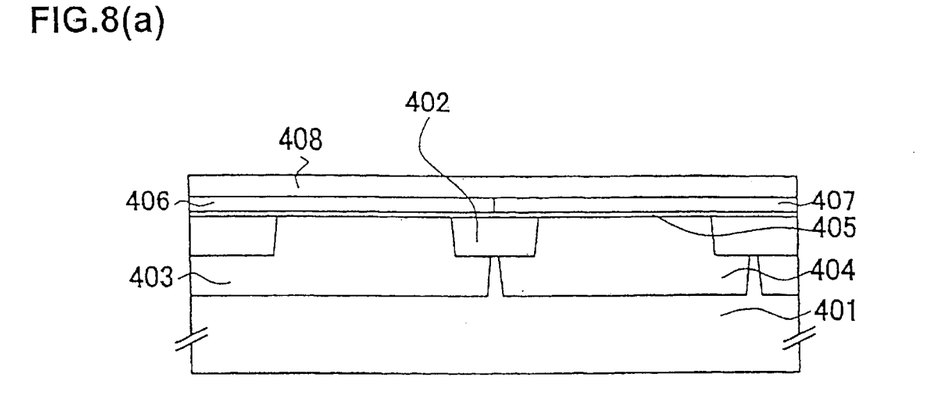
Figure 8B:
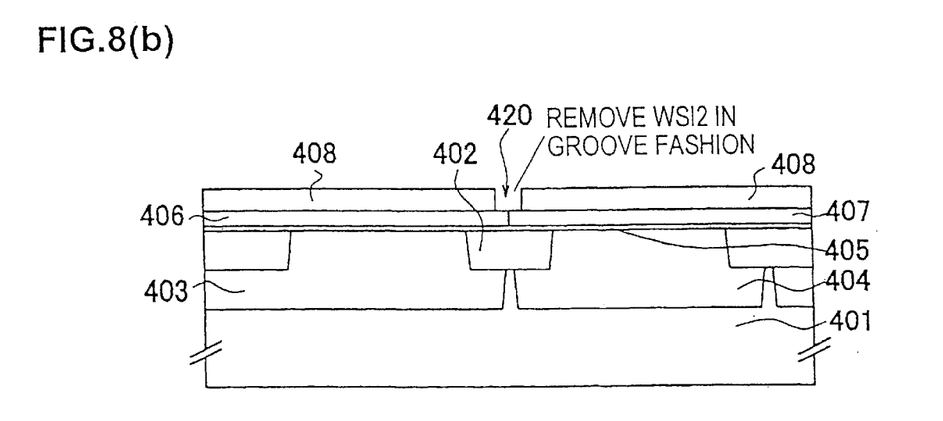

Next, referring to FIG. 8, a method for manufacturing the semiconductor device in the fourth embodiment will be described. FIG. 8 is a cross-sectional view for manufacturing steps showing the semiconductor device manufacturing method in this embodiment. Since the steps (FIGS. 8A and 8B) of the semiconductor device manufacturing method in this embodiment until a groove region is formed are the same as those in the first embodiment (FIGS. 2A and 2B), no description will be given to these steps herein.

Figure 8C:
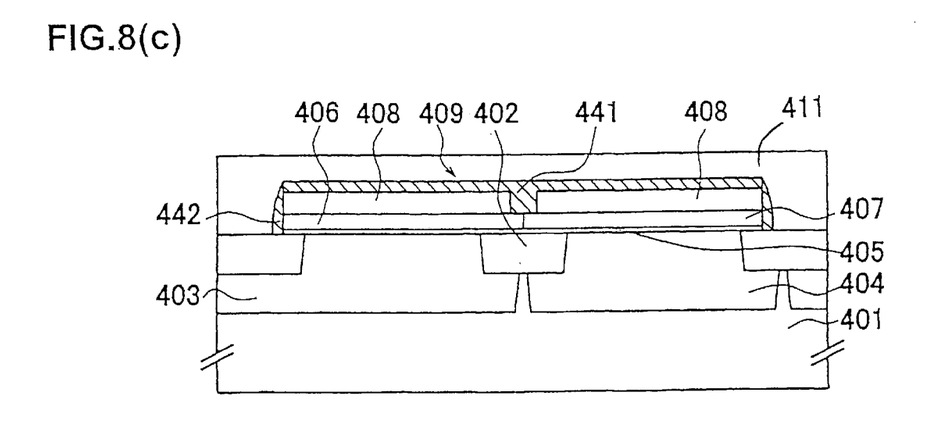

As shown in FIG. 8C, after a WSi2 layer 408 on the boundary portion between an NMOS part and a PMOS part is removed by the photolithographic method and the etching method to thereby form a groove region 420, a nitride film 441 is deposited on the entire surface by, for example, the CVD method and the surface of the nitride film 441 is flattened by a CMP method.

Next, a gate electrode 409 is formed by the photolithographic method and the etching method. A source/drain layer 410 is then formed on each of the P well 403 and the N well 404 by the photolithographic method and the implantation method.

Further, a nitride film is deposited on the entire surface by, for example, the CVD method and then a sidewall 442 made of a nitride film is formed by an etch-back method.

Thereafter, after an oxide film 411 is deposited on the entire surface by, for example, the CVD method, contacts 412 and 413 are formed on the source/drain layer 410 and the gate electrode 409, respectively by the photolithographic method and the etching method in different steps.

In the fourth embodiment, no nitride film is formed in a region on the source/drain layer 410 in which region the contact 412 is formed and the nitride film and the WSi2 layer is formed in a region on the gate electrode 409 in which region the contact 413 is formed. Due to this, the contact 412 on the source/drain layer 410 and the contact 413 on the gate electrode 409 cannot be simultaneously formed in the same step.

As can be seen, in this embodiment, since the nitride film is forming a P well 503 and an N well 504, respectively. Also a source/drain layer 510 is formed on each of the P well 503 and the N well 504 by the photolithographic method and the implantation method.

A gate oxide film 505 is formed on the entire surface on the P will 503 and the N well 504 by, for example, the thermal oxidization method. Polycrystalline silicon layers 506 and 507 are deposited on the gate oxide film 505. N type impurities such as arsenic are injected into the plycrystalline silicon layer 506 on the NMOS part and P type impurities such as boron are injected into the polycrystalline silicon layer 507 on the PMOS part by, for example, the photolithographic method and the implantation method, thereby forming an N polycrystalline silicon layer 506 and P$^+$polycrystalline silicon layer 507, respectively.

The first conductive layer 508 such as a WSi2 layer is formed on the polycrystalline silicon layers 506 and 507 by, for example, the sputtering method or the CVD method. Also, a groove region 520 is formed in the WSi2 layer 508 on the boundary portion between the NMOS part and the PMOS part to thereby isolate the WSi2 layer 508 on the NMOS part from the WSi2 layer 508 on the PMOS part as in the case of the first embodiment.

In addition, a gate electrode 509 is formed by the photolithographic method and the etching method and an oxide film 511 is formed by, for example, the CVD method.

In the fifth embodiment, differently from the fourth embodiment, no nitride film is formed in the groove region. On the other hand, similarly to the fourth embodiment, a sidewall made of a nitride film is formed in the groove region and on the entire surface on the WSi2 layer and the sidewall made of the nitride film is formed on the side surface of the gate electrode portion, it is possible to form the contact on the source/drain layer in a self-aligned manner to the gate electrode. As a result, it is possible to reduce the mutual diffusion of the P type impurities and the N type impurities in the polycrystalline silicon layers and to facilitate forming the contact on the source/drain layer. Besides, since the contact can be formed on the source/drain layer in a self-aligned manner, this structure is advantageous to provide a semiconductor device having a finer structure.

Fifth Embodiment

In the fourth embodiment stated above, description has been given to a case where the nitride film is formed in the groove region and on the entire surface on the WSi2 layer. In the fifth embodiment, no nitride film is formed in a groove region and a nitride film is formed only on a WSi2 layer.

Figure 9A:
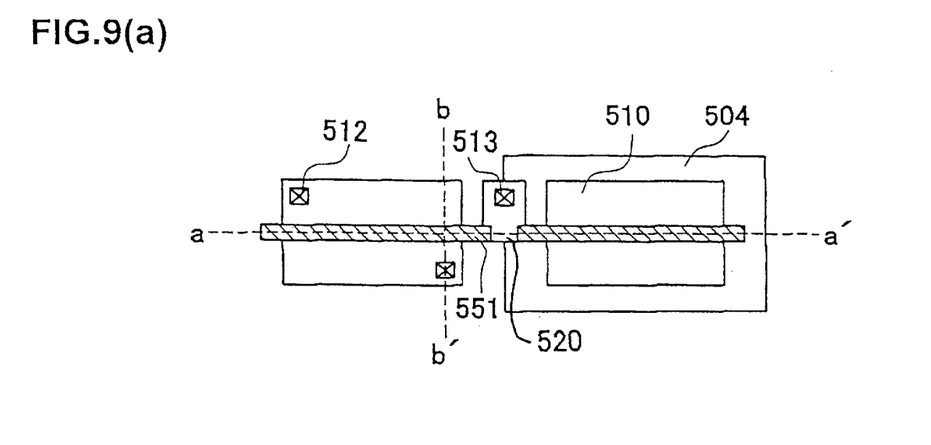
Figure 9B:
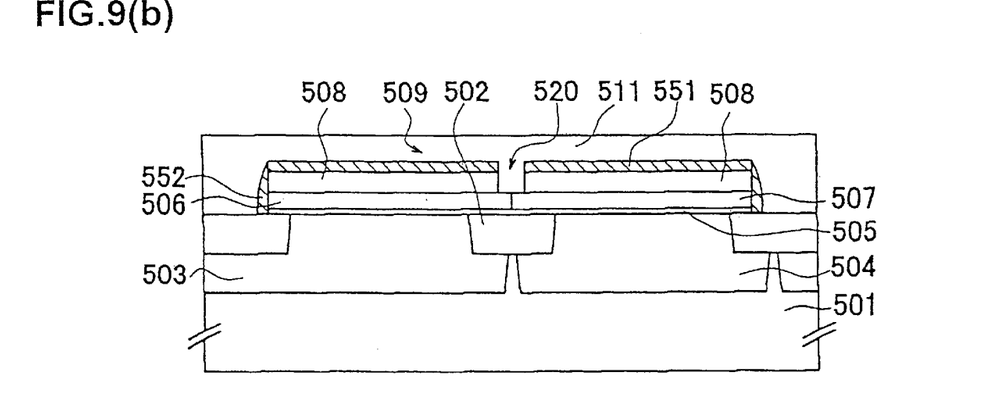
Figure 9C:
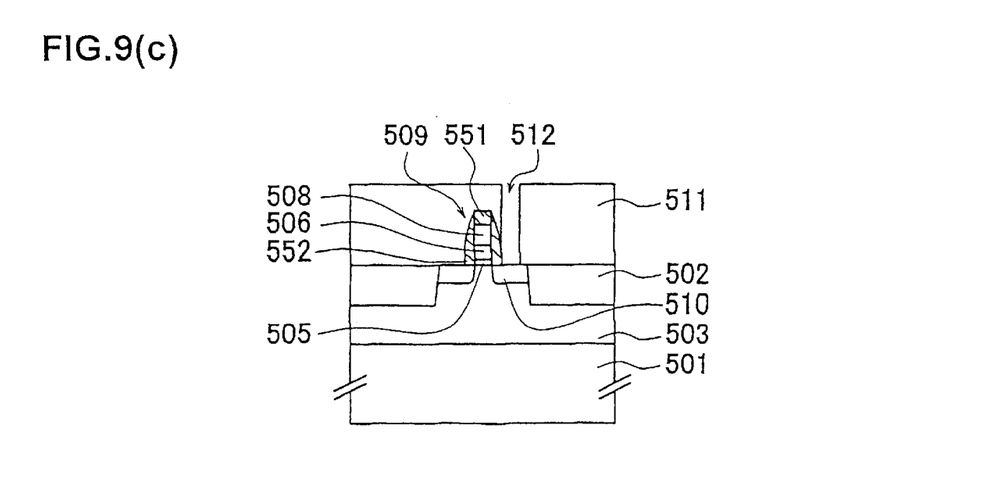

Now, referring to FIG. 9, the constitution of a semiconductor device in the fifth embodiment will be described. FIG. 9A is a top view showing the constitution of the semiconductor device in the third embodiment. FIG. 9B is a cross-sectional view taken along line a–a' of FIG. 9A. FIG. 9C is a cross-sectional view taken along line b–b' of FIG. 9A.

First, as shown in FIG. 9, an element isolation insulating film 502 is formed on a silicon substrate 501 by, for example, the STI method. Impurities are injected into an NMOS part and a PMOS part by the photolithographic method and the implantation method, thereby formed on the gate electrode portion. Due to this, it is possible to form a contact on the source/drain layer in a self-aligned manner to the gate electrode.

Further, contacts 512 and 513 are formed on the source/drain layer 510 and the gate electrode 509, respectively. In this embodiment, differently from the fourth embodiment, no nitride film is formed in a region on the gate electrode in which region the contact is formed as shown in FIG. 9A. Due to this, the contact on the source/drain layer and the contact on the gate electrode can be formed in the same step using the same mask.

Figure 10A:
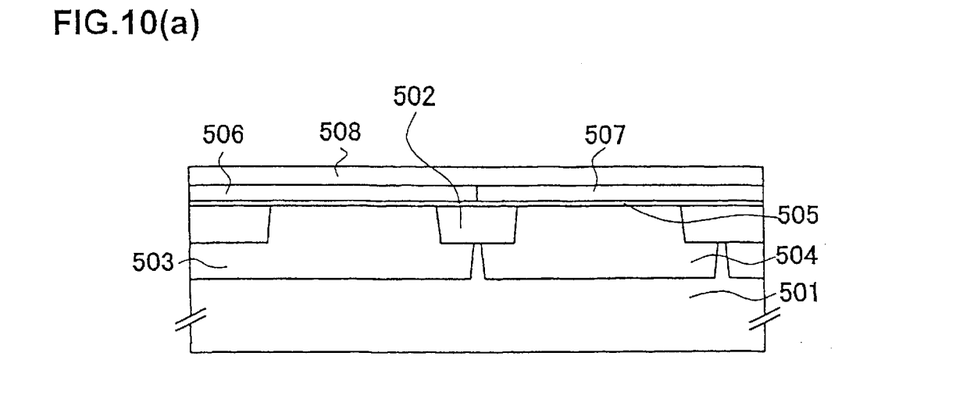

Next, referring to FIG. 10, a method for manufacturing the semiconductor device in the fifth embodiment will be described. FIG. 10 is a cross-sectional view for manufacturing steps showing the semiconductor device manufacturing method in this embodiment. Since the steps (FIG. 10A) of the semiconductor device manufacturing method in this embodiment until a WSi2 layer is deposited on an N$^+$ polycrystalline silicon layer and a P$^+$ polycrystalline silicon layer are the same as those in the first embodiment (FIG. 2A), no description will be given to the steps herein.

Figure 10B:
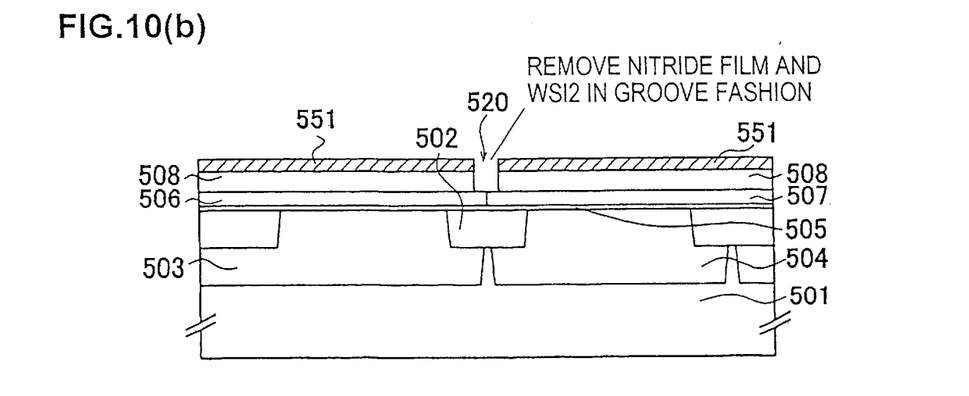

As shown in FIG. 10B, after a WSi2 layer 508 is deposited on the entire surface on a polycrystalline silicon layer consisting of an N+ polycrystalline silicon layer 506 and a P+ polycrystalline silicon layer 507, a nitride film 551 is deposited on the entire surface by, for example, the CVD method.

Thereafter, the nitride film 551 and the WSi2 layer 508 on the boundary portion between an NMOS part and a PMOS part are removed to by the photolithographic method and the etching method thereby form a groove region 520. At the same time, the nitride film 551 and the WSi2 layer 508 in a region on the gate electrode 509 in which region a contact 513 is formed, are removed.

Mask data used by this photolithographic method can be created by synthesizing mask data used to form wells with mask data on the contact formed on a gate electrode. Using the mask thus synthesized, it is possible to form the groove region 520 and, at the same time, to remove the nitride film 551 and the WSi2 layer 508 in the region on the gate electrode 509 in which region the contact 513 is formed.

Next, a gate electrode 509 is formed by the photolithographic method and the etching method. A source/drain layer 510 is then formed on each of the P well 503 and the N well 504 by the photolithographic method and the implantation method.

Figure 10C:
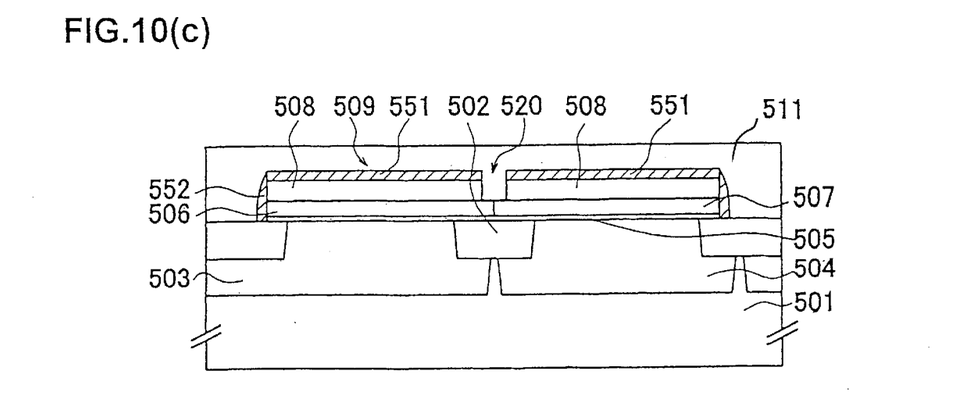

Next, a nitride film is deposited on the entire surface by, for example, the CVD method and then a sidewall 552 made of a nitride film is formed by the etching method as shown in FIG. 10C. Further, after depositing an oxide film 511 on the entire surface by, for example, the CVD method, contacts 512 and 513 are formed simultaneously on the source/drain layer 510 and the gate electrode 509, respectively by the photolithographic method and the etching method.

In the fifth embodiment, since the nitride film and the WSi2 layer in the region on the gate electrode in which region the contact is formed, are removed when the groove region is formed, it is possible to form the contact on the source/drain layer and the contact on the gate electrode simultaneously in the same step using the same mask.

As can be seen, in this embodiment, since the nitride film and the first conductive layer in the contact formation region on the gate electrode, the contact on the source/drain layer and the contact on the gate electrode can be formed simultaneously in the same step using the same mask. As a result, it is possible to reduce the mutual diffusion of the N type impurities and the P type impurities in the polycrystalline silicon layers and to simplify a manufacturing process to thereby reduce manufacturing cost. Besides, since the contact can be formed on the source/drain layer in a self-aligned manner, this structure is advantageous to provide a semiconductor device having a finer structure.

While the preferred embodiments according to the present invention have been described so far, the present invention should not be limited to these constitutions. Those skilled in the art could contrive various changes and modifications within the scope of the technical concept of the present invention as defined in claims which follows. It is appreciated that such changes and modifications fall within the technical scope of the present invention.

The embodiments have been described above while taking the constitution in which the tungsten silicide layer is adopted as the first conductive layer an example. The present invention should not be limited to this constitution. For example, the other material such as metallic tungsten can be employed to work the present invention.

Furthermore, the embodiments have been described above while taking the constitution in which the cobalt silicide layer is adopted as the first conductive layer as an example. The present invention should not be limited to this constitution. For example, a layer formed out of the other material such as titanium silicide can be adopted to work the present invention. In that case, it is preferable that a material having a low impurity diffusion coefficient and high conductivity is used.

Moreover, the embodiments have been described above while taking a case where the second conductive layer (or cobalt silicide layer) is formed in a self-aligned manner as an example. Alternatively, the second conductive layer can be formed using conventional thin film formation means.

As stated so far, according to the present invention, the groove region is formed in the WSi2 layer on the boundary region between the PMOS part and the NMOS part and the WSi2 layer on the PMOS part is isolated from the WSi2 layer on the NMOS part. Hence, it is possible to reduce the mutual diffusion of impurities through the WSi2 layers.

What is claimed is:

1. A dual-gate CMOS semiconductor device manufacturing method comprising:

forming a P well and an N well on a semiconductor substrate using a first masking pattern;

forming a gate insulating film on the P well and the N well;

forming a polycrystalline silicon layer including a first polycrystalline silicon layer containing N type impurities and a second polycrystalline silicon layer containing P type impurities, on the gate insulating film;

forming a first conductive layer on an entire surface of the first and second polycrystalline silicon layers;

removing the first conductive layer on a predetermined region of the polycrystalline silicon layer including a boundary between the first polycrystalline silicon layer containing the N type impurities and the second polycrystalline silicon layer layer containing the P type impurities using a second masking pattern, to thereby form an opening exposing the upper surface of the polycrystalline silicon layer;

forming a gate electrode by photolithography and etching;

forming a source/drain layer on each of the P well and the N well by photolithography and ion implantation, after said forming a gate electrode;

forming a metal suicide on surfaces of the first and second polycrystalline silicon layers at the opening; and depositing an insulating film on the first conductive layer, and on the metal silicide to fill the opening.

2. A dual-gate CMOS semiconductor device manufacturing method according to claim 1, wherein the second masking pattern is created by synthesizing the first masking pattern.

3. A dual-gate CMOS semiconductor device manufacturing method according to claim 1, further comprising:

forming a sidewall on the gate electrode before forming the metal silicide, said forming a metal silicide comprising a self-aligned process.

the second masking pattern is created by synthesizing the first masking pattern.

4. A dual-gate CMOS semiconductor device manufacturing method of claim 1, further comprising forming nitride sidewalls within the opening.

5. A dual-gate CMOS semiconductor device manufacturing method of claim 1, wherein said forming a metal silicide also comprises forming the metal silicide on the source/drain layer.

6. A dual-gate CMOS semiconductor device manufacturing method comprising:

forming a P well and an N well on a semiconductor substrate using a first masking pattern;

forming a gate insulating film on the P well and the N well;

forming a polycrystalline silicon layer including a first polycrystalline silicon layer containing N type impurities and a second polycrystalline silicon layer containing P type impurities, on the gate insulating film;

forming a first conductive layer on an entire surface of the first and second polycrystalline silicon layers;

removing the first conductive layer on a predetermined region of the polycrystalline silicon layer including a boundary between the first polycrystalline silicon layer containing the N type impurities and the second polycrystalline silicon layer containing the P type impurities using a second masking pattern, to thereby form an opening exposing the upper surface of the polycrystalline silicon layer;

forming a gate electrode by photolithography and etching;

forming a source/drain layer on each of the P well and the N well by photolithography and ion implantation, after said forming a gate electrode; and embedding an insulating material in the opening of the first conductive layer so that the embedded insulating material is almost equal in height to the first conductive layer, the said embedding being between said removing the first conductive layer to form opening and said forming a gate electrode.

7. A dual-gate CMOS semiconductor device manufacturing method of claim 6, further comprising depositing an insulating film on the first conductive layer and the insulating material within the opening.

8. A dual-gate CMOS semiconductor device manufacturing method comprising:

forming first and second wells on a semiconductor substrate;

forming a gate insulating film on the first and second wells;

forming a polycrystalline silicon layer on the gate insulating film, the polycrystalline silicon layer including a first polycrystalline silicon layer over the first well and a second polycrystalline silicon layer over the second well;

forming a conductive layer on an entire surface of the first and second polycrystalline silicon layers;

forming an opening in the conductive layer so as to expose a predetermined region of the upper surface of the polycrystalline silicon layer including a boundary between the first polycrystalline silicon layer and the second polycrystalline silicon layer;

forming a metal silicide on surfaces of the first and second polycrystalline silicon layers within the opening; and depositing an insulating film on the conductive layer, and on the metal silicide to fill the opening.

9. A dual-gate CMOS semiconductor device manufacturing method of claim 8, further comprising:

forming a gate electrode by etching the polycrystalline silicon layer, the conductive layer and the gate insulating film; and forming source and drain regions in the first and second well regions after said forming a gate electrode.

10. A dual-gate CMOS semiconductor device manufacturing method of claim 9, further comprising forming self-aligned nitride side walls on the gate electrode.

11. A dual-gate CMOS semiconductor device manufacturing method of claim 9, further comprising forming nitride side walls within the opening in the conductive layer.

12. The dual-gate CMOS semiconductor device manufacturing method of claim 9, wherein said forming a metal suicide comprises forming the metal silicide on the source and drain regions.

13. The dual-gate CMOS semiconductor device manufacturing method of claim 8, wherein the first and second wells respectively are a P well and an N well, and the first and second polycrystalline silicon layers respectively are N doped and P doped.

* * * * *